(12) United States Patent
Yang et al.

(10) Patent No.: US 9,678,180 B2
(45) Date of Patent: Jun. 13, 2017

(54) COAXIAL CABLE MAGNETIC RESONANCE IMAGE (MRI) COIL

(71) Applicant: Quality Electrodynamics, LLC, Mayfield Village, OH (US)

(72) Inventors: Xiaoyu Yang, Indiana, PA (US); Tsinghua Zheng, Aurora, OH (US); Yong Wu, Shaker Heights, OH (US); Matthew Finnerty, University Heights, OH (US)

(73) Assignee: Quality Electrodynamics, LLC, Mayfield Village, OH (US)

( * ) Notice: Subject to any disclaimer, the term of this patent is extended or adjusted under 35 U.S.C. 154(b) by 524 days.

(21) Appl. No.: 14/270,399

(22) Filed: May 6, 2014

(65) Prior Publication Data
US 2015/0323620 A1 Nov. 12, 2015

(51) Int. Cl.
| | | |
|---|---|---|
| *G01V 3/00* | (2006.01) | |
| *G01R 33/341* | (2006.01) | |
| *G01R 33/34* | (2006.01) | |
| *G01R 33/36* | (2006.01) | |
| *G01R 33/54* | (2006.01) | |

(52) U.S. Cl.
CPC ........... *G01R 33/341* (2013.01); *G01R 33/34* (2013.01); *G01R 33/3628* (2013.01); *G01R 33/543* (2013.01)

(58) Field of Classification Search
CPC .. G01R 33/341; G01R 33/34; G01R 33/3628; G01R 33/543
USPC ........................................................ 324/318
See application file for complete search history.

(56) References Cited

U.S. PATENT DOCUMENTS

| | | | | |
|---|---|---|---|---|
| 4,083,006 A | * | 4/1978 | Yokoshima | G01R 29/00 343/703 |
| 4,605,899 A | * | 8/1986 | Eumurian | G01R 33/028 324/258 |
| 4,775,837 A | * | 10/1988 | Roschmann | G01R 33/3628 324/318 |
| 4,816,766 A | * | 3/1989 | Zabel | G01R 33/341 324/318 |

(Continued)

FOREIGN PATENT DOCUMENTS

DE WO 2013013680 A1 * 1/2013 ............. H01Q 7/005

OTHER PUBLICATIONS

Cassidy et al., Determining the Tuning and Matching Requirements of RF Coils Using Electromagnetic Simulation and Electric Circuit Analysis, 2005, Concepts in Magnetic Resonance Part B (Magnetic Resonance Engineering), vol. 25B(1), pp. 27-41.*

*Primary Examiner* — Susan Lee
(74) *Attorney, Agent, or Firm* — Eschweiler & Potashnik, LLC

(57) ABSTRACT

Example magnetic resonance imaging (MRI) radio frequency (RF) coils are described. An MRI RF coil may include a first terminal and a second terminal that are connected by a coaxial cable. Rather than rely exclusively on two terminal passive components (e.g., resistor, inductor, capacitor), example coax MRI RF coils rely on the capacitance that can be created in the coax cable between the inner conductor and the outer conductor. The capacitance of the coil may be controlled by selectively disrupting (e.g., cutting, stripping) the outer conductor, the inner conductor, or the dielectric material disposed between the inner and outer conductor.

15 Claims, 10 Drawing Sheets

(56) References Cited

U.S. PATENT DOCUMENTS

| | | | | |
|---|---|---|---|---|
| 5,565,778 A * | 10/1996 | Brey | ................... | G01R 33/34 |
| | | | | 324/318 |
| 6,636,040 B1 * | 10/2003 | Eydelman | ........ | G01R 33/34053 |
| | | | | 324/318 |
| 6,847,210 B1 * | 1/2005 | Eydelman | ............ | G01R 33/341 |
| | | | | 324/318 |
| 7,573,432 B1 * | 8/2009 | Eydelman | ............ | G01R 33/341 |
| | | | | 324/318 |
| 2013/0069652 A1 * | 3/2013 | Otake | ................ | G01R 33/3664 |
| | | | | 324/322 |

* cited by examiner

COAXIAL CABLE MAGNETIC RESONANCE IMAGE (MRI) COIL

BACKGROUND

Magnetic resonance imaging (MRI) involves the transmission and receipt of radio frequency (RF) energy. RF energy may be transmitted by a coil. Resulting magnetic resonance (MR) signals may also be received by a coil. In early MRI, RF energy may have been transmitted from a single coil and resulting MR signals received by a single coil. Later, multiple receivers may have been used in parallel acquisition techniques. Similarly, multiple transmitters may have been used in parallel transmission techniques.

RF coils create the B1 field that rotates the net magnetization in a pulse sequence. RF coils may also detect processing transverse magnetization. Thus, RF coils may be transmit coils, receive coils, or transmit and receive coils. An imaging coil needs to be able to resonate at a selected Larmor frequency. Imaging coils include inductive elements and capacitive elements. Conventionally, the inductive elements and capacitive elements have been implemented using two terminal passive components (e.g., capacitors). The resonant frequency, v, of an RF coil is determined by the inductance (L) and capacitance (C) of the inductor capacitor circuit according to:

$$v = \frac{1}{2\Pi\sqrt{LC}}$$

Imaging coils may need to be tuned. Tuning an imaging coil may include varying the performance of a capacitor. Recall that frequency: $f=\omega/(2\pi)$, wavelength: $\lambda=c/f$, and $\lambda=4.7$ m at 1.5 T. Recall also that the Larmor frequency: $f_0=\gamma B_0/(2\pi)$, where $\gamma/(2\pi)=42.58$ MHz/T; at 1.5 T, $f_0=63.87$ MHz; at 3 T, $f_0=127.73$ MHz; at 7 T, $f_0=298.06$ MHz. Basic circuit design principles include the fact that capacitors add in parallel (impedance $1/(jC\omega)$) and inductors add in series (impedance $jL\omega$).

There are many design issues associated with MRI RF coil design. For example, the inductance of a conventional coil depends on the geometry of the coil. For a square coil with a side length a and wire diameter f: $L=[\mu_0/\pi]$ $[-4a+2a\sqrt{2}-2a \log(1+\sqrt{2})+2a \log(4a/f)]$. For a loop coil with loop diameter d and wire diameter f: $L=[\mu_0 d/2]$ [ $\log(8d/f)-2$]. Thus, the selection of the geometry of a coil determines, at least in part, the inductance of the coil.

The resistance of a coil also depends on the geometry of the coil. The resistance R of a conductor of length l and cross-sectional area A is $R=\mu l/A$, where $\rho$ is the conductor resistivity and is a property of the conductor material and the temperature. For a copper wire coil with loop diameter d and wire diameter f: $R=d\rho_{Cu}/(f\delta_{Cu})$. For a copper foil coil with loop diameter d, copper thickness t, and copper width w: $R=\pi d\rho_{Cu}/(2w\delta_{Cu})$, where t is much greater than the copper skin depth and w is much greater than t. Thus, the selection of the geometry of a coil and the material (e.g., wire, foil) determines, at least in part, the inductance of the coil. The length of the loop also impacts the properties of the coil.

Coils may be characterized by their signal voltage, which is the electro-motive force (emf) induced in a coil: $\xi=-\partial\phi/\partial t \propto -\partial(B_1 \sim M_0)/\partial t$, where $\phi$ is the magnetic flux across the coil (closed loop), magnetization $M_0=N\gamma^2(h/(2\pi)^2 s(s+1)B_0/(3k_B T_S)=\sigma_0 B_0/\mu_0$, where N is the number of nuclear spins s per unit volume (s=½ for protons) and $T_S$ is the temperature of the sample. Since $\theta_0=\gamma B_0$, $\xi \propto \omega_0^2$. The noise in a coil may be thermal (e.g., $v=(4k_B T_S R \Delta f)^{1/2}$, where R is the total resistance and $\Delta f$ is the bandwidth of the received signal). The signal to noise ratio (SNR) for a coil may be described by $\xi/v$.

Coils may be used for transmitting RF energy that is intended to cause nuclear magnetic resonance (NMR) in a sample. The frequency at which NMR will be created depends on the magnetic field present in the sample. Both the main magnetic field B0 produced by the MRI apparatus and the additional magnetic field B1 produced by a coil contribute to the magnetic field present in the sample. For a circular loop coil, the transmit B1 field equals the coil sensitivity. A circular loop of radius a carrying a current I produces on axis the field: $B=\mu_0 a^2/[2(a^2+z^2)^{3/2}]$.

Additionally, RF coils for MRI may need to be tuned and matched. Tuning involves establishing or manipulating the capacitance in a coil so that a desired resistance is produced. Matching involves establishing or manipulating the capacitance in a coil so that a desired reactance is achieved. When tuning, the impedance z may be described by $Z=R+jX=1/(1/(r+jL\omega)+jC\omega)$. Tuning may be performed to achieve a desired tuning frequency for a coil. $\omega_0$ identifies the desired tuning frequency. $\omega_0$, may be, for example, 63.87 MHz at 1.5 T. The size of a conventional coil facilitates estimating inductance L. With an estimate of L in hand, values for capacitors can be computed to produce a desired resonant peak in an appropriate location with respect to $\omega_0$. Once capacitors are selected, the resonant peak can be observed and a more accurate L can be computed. The capacitors can then be adjusted to produce the desired resistance. Once the desired resistance is achieved, then capacitance can be adjusted to cancel reactance.

There are a number of complicated design issues associated with conventional RF coils. Conventional coil design involves selecting and manipulating capacitors. The selection and manipulation depends on many factors including coil material (e.g., foil, wire), coil geometry (e.g., square, loop), fabrication technique (e.g., surface mount, etched onto printed circuit board) and other choices. Coil design is further complicated by the fact that splitting a coil with capacitors may affect radiation losses, dielectric losses, resistance, and fabrication issues (e.g., additional soldering).

Conventional coils may use PIN diodes. When forward-biased, a PIN diode may produce a negligible resistance (e.g., 0.1Ω), which is essentially a short-circuit. When reverse-biased, a PIN diode may produce a high resistance (e.g., 200 kΩ) in parallel with a low capacitance (e.g., ~2 pF), which is essentially an open-circuit. Conventional coils may also be designed with a single element or two or more elements. The number of elements may affect the properties of the coil. Additionally, the size, width, and material of the conductor may affect the properties of the coil.

Thus, conventional coil design may be a complicated process that requires numerous decisions. Additionally, conventional coil fabrication may be a complicated process that requires accurately implementing manufactures that reflect the design decisions. Simpler and less costly approaches are constantly sought.

Prior Art FIG. 1 illustrates a schematic of a simple conventional RF coil 100 for MRI. The coil 100 is illustrated as a loop 110. Loop 110 has elements that produce a resistance (e.g., resistor 120) and that produce an inductance (e.g., inductor 130). A conventional loop may include a matching capacitor 140 and tuning capacitor 150. Conventionally, the resistor 120, inductor 130, and capacitor 150 may all have been two terminal passive elements that were soldered to copper wire or copper foil that was attached to a printed circuit board.

A resistor may be, for example, a passive, two-terminal electrical component that implements electrical resistance as a circuit element. Resistors reduce current flow. Resistors also lower voltage levels within circuits. Resistors may have fixed resistances or variable resistances. The current that flows through a resistor is directly proportional to the voltage applied across the resistor's terminals. This relationship is represented by Ohm's Law: V=IR, where I is the current through the conductor, V is the potential difference across the conductor, and R is the resistance of the conductor.

An inductor, which may also be referred to as a coil or reactor, may be a passive two-terminal electrical component that resists changes in electric current. An inductor may be made from, for example, a wire that is wound into a coil. When a current flows through the inductor, energy may be stored temporarily in a magnetic field in the coil. When the current flowing through the inductor changes, the time-varying magnetic field induces a voltage in the inductor. The voltage will be induced according to Faraday's law and thus may oppose the change in current that created the voltage.

A capacitor may be a passive, two-terminal electrical component that is used to store energy. The energy may be stored electrostatically in an electric field. Although there are many types of practical capacitors, capacitors tend to contain at least two electrical conductors that are separated by a dielectric. The conductors may be, for example, plates and the dielectric may be, for example, an insulator. The conductors may be, for example, thin films of metal, aluminum foil or other materials. The non-conducting dielectric increases the capacitor's charge capacity. The dielectric may be, for example, glass, ceramic, plastic film, air, paper, mica, or other materials. Unlike a resistor, a capacitor does not dissipate energy. Instead, a capacitor stores energy in the form of an electrostatic field between its conductors.

When there is a potential difference across the conductors, an electric field may develop across the dielectric. The electric field may cause positive charge (+Q) to collect on one conductor and negative charge (−Q) to collect on the other conductor.

Prior Art FIG. 2 illustrates a schematic of another simple RF coil 200 for MRI. The coil 200 is illustrated as a square loop 210. Loop 210 has elements that produce a resistance (e.g., resistor 220) and that produce an inductance (e.g., inductor 230). A conventional loop may include a capacitor 240 and capacitor 250 that work together to achieve matching. Once again, the resistor 220, inductor 230, and capacitors 240 and 250 may have been soldered to copper wire or copper foil that was attached to a printed circuit board. Coil 200 is contrasted with coil 1 (Prior Art FIG. 1) that included capacitor 150 for tuning purposes.

Prior Art FIG. 3 illustrates a cross-section of a conventional coaxial ("coax") cable 300. Cable 300 includes an inner conductor 310 which may be, for example, a copper wire. Cable 300 also includes an outer conductor 330 which may be, for example, a copper mesh. A dielectric spacer 320 may reside between the inner conductor 310 and the outer conductor 330. The cable 300 may be protected by an outer cover 340.

BRIEF DESCRIPTION OF THE DRAWING

The accompanying drawings, which are incorporated in and constitute a part of the specification, illustrate various example systems, methods, and other embodiments of various aspects of the invention. It will be appreciated that the illustrated element boundaries (e.g., boxes, groups of boxes, or other shapes) in the figures represent one example of the boundaries. One of ordinary skill in the art will appreciate that in some embodiments one element may be designed as multiple elements, multiple elements may be designed as one element, an element shown as an internal component of another element may be implemented as an external component and vice versa, and so on. Furthermore, elements may not be drawn to scale.

Prior Art

Prior Art

Prior Art

Prior Art

DETAILED DESCRIPTION

Figure 1:
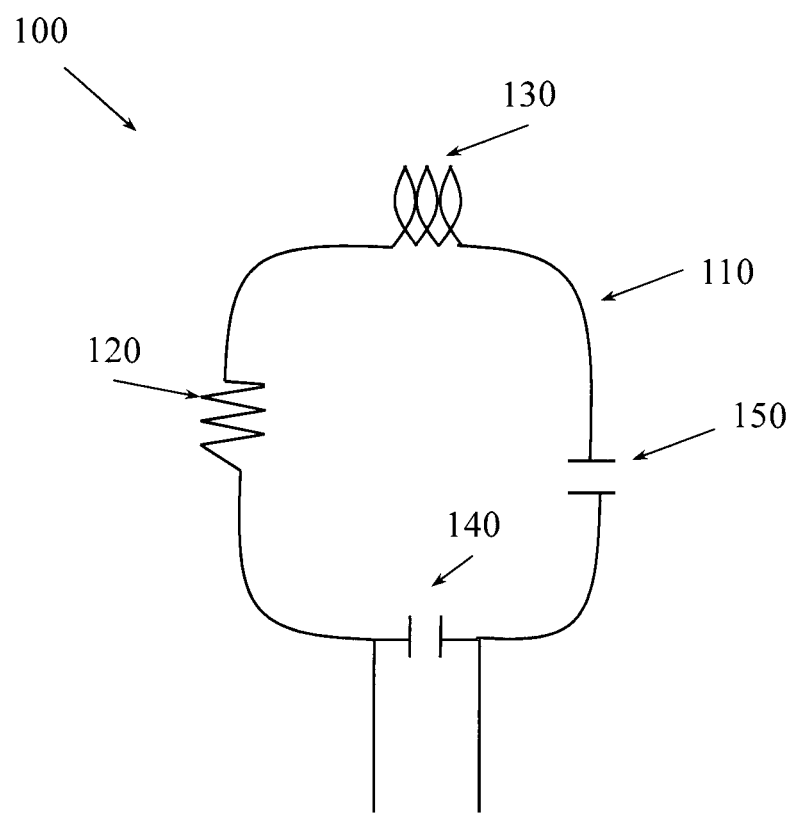
FIG. 1 illustrates portions of a radio frequency (RF) coil for magnetic resonance imaging (MRI).
Figure 2:
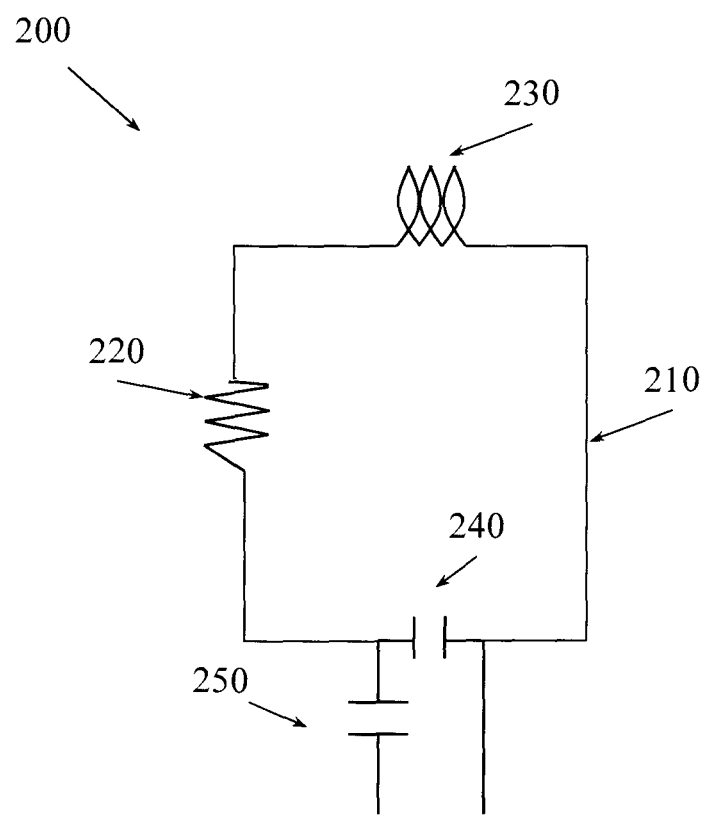
FIG. 2 illustrates portions of an RF coil for MRI.
Figure 3:
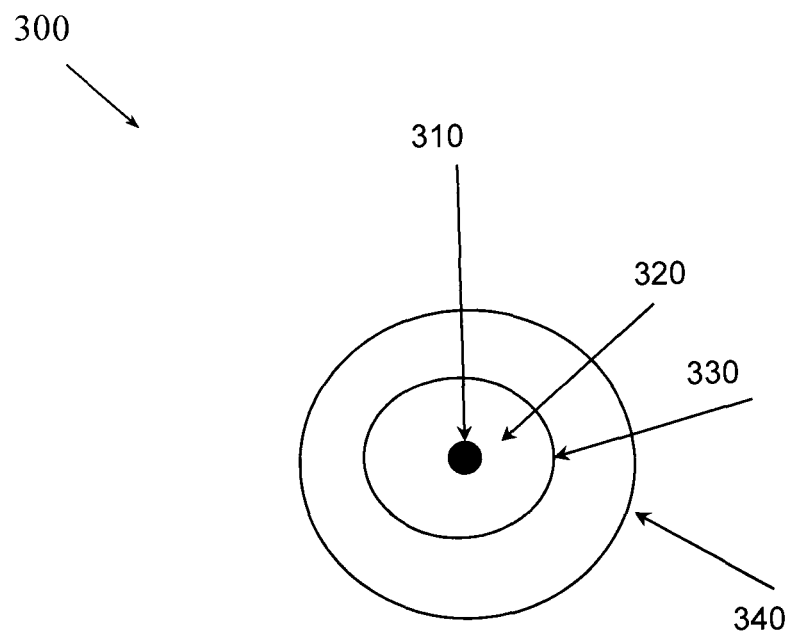
FIG. 3 illustrates a portion of a coaxial ("coax") cable.

The inner conductor, dielectric spacer, and outer conductor of a coaxial cable have properties that facilitate producing the capacitance necessary for producing an MRI coil. As illustrated in Prior Art FIG. 1, a simple RF coil 100 may be a loop 110 with elements that produce a resistance (e.g., resistor 120) and that produce an inductance (e.g., inductor 130). A conventional loop may include a matching capacitor 140. Conventionally, the resistor 120, inductor 130, and capacitor 140 may all have been two terminal passive elements that are soldered to copper wire or copper foil that was attached to a printed circuit board. Example apparatus do not rely exclusively on soldered on components like resistor 120, inductor 130, or capacitor 140 to produce an MRI coil. Instead, example apparatus manipulate the inner conductor, dielectric spacer, or outer conductor of a coaxial coil to manipulate capacitance for an MRI coil. A conventional MRI coil may have conventional copper wire or copper foil printed on a conventional circuit board with discrete components (e.g., resistors, inductors, capacitors) soldered to the circuit board. Example apparatus may have a coaxial cable that has been manipulated (e.g., selectively cut) to produce the desired properties.

Figure 4:
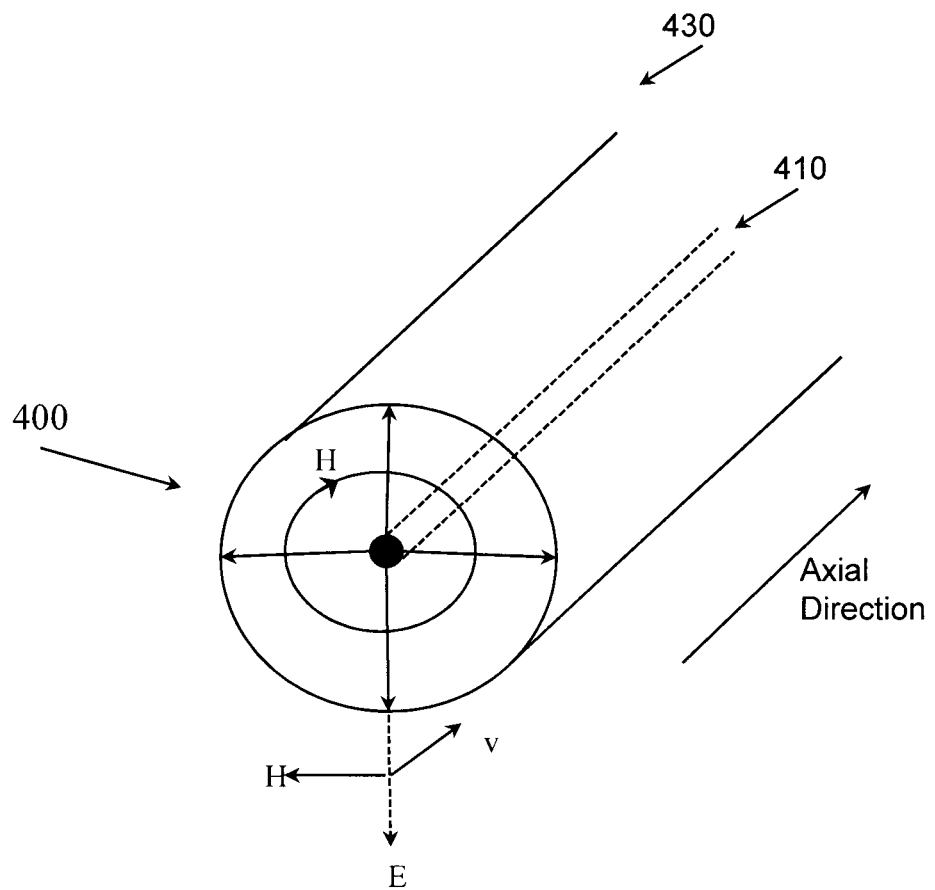
FIG. 4 illustrates portions of a coax cable.

Prior Art FIG. 4 illustrates a portion of a coax cable 400. Cable 400 includes an inner conductor 410 and an outer conductor 430. In coax cable 400, energy propagates in an axial direction in the region between the two conductors. In FIG. 4, E represents an electric field, H represents a magnetic field, and V represents a velocity showing axial direction of propagation. For a cylindrical geometry like coaxial cable 400, the capacitance may be stated as a capacitance per unit length. The charge resides on the outer surface of the inner conductor 410 and the inner wall of the outer conductor 430. The capacitance expression is:

$$\frac{C}{L} = \frac{2\pi\kappa\varepsilon_0}{\ln\left[\frac{b}{a}\right]}$$

where a represents the diameter of the inner conductor 410 and b represents the distance from the center of the inner conductor 410 to the inner edge of the outer conductor 430.

Since the charge resides on the outer surface of the inner conductor 410 and the inner wall of the outer conductor 430, changes to the outer surface of the inner conductor 410 or changes to the inner surface of the outer conductor 430 may change the capacitance of the coaxial cable.

The capacitance for cylindrical or spherical conductors can be obtained by evaluating the voltage difference between the conductors. Gauss' law applied to an infinite cylinder in a vacuum reveals that the electric field outside a charged cylinder is:

$$E = \frac{\lambda}{2\Pi\varepsilon_0 r}.$$

the voltage between the cylinders is determined by integrating the electric field along a radial line according to:

$$\Delta V = \frac{\lambda}{2\Pi\varepsilon_0}\int_a^b \frac{1}{r}dr = \frac{\lambda}{2\Pi\varepsilon_0}\ln\left[\frac{b}{a}\right].$$

The capacitance per unit length is defined as:

$$\frac{C}{L} = \frac{\lambda}{\Delta V} = \frac{2\pi k e_0}{\ln\left[\frac{b}{a}\right]}$$

when the volume between the inner conductor 410 and the outer conductor 430 is filled by a dielectric of dielectric constant k, as is the case for cable 400.

Figure 5:
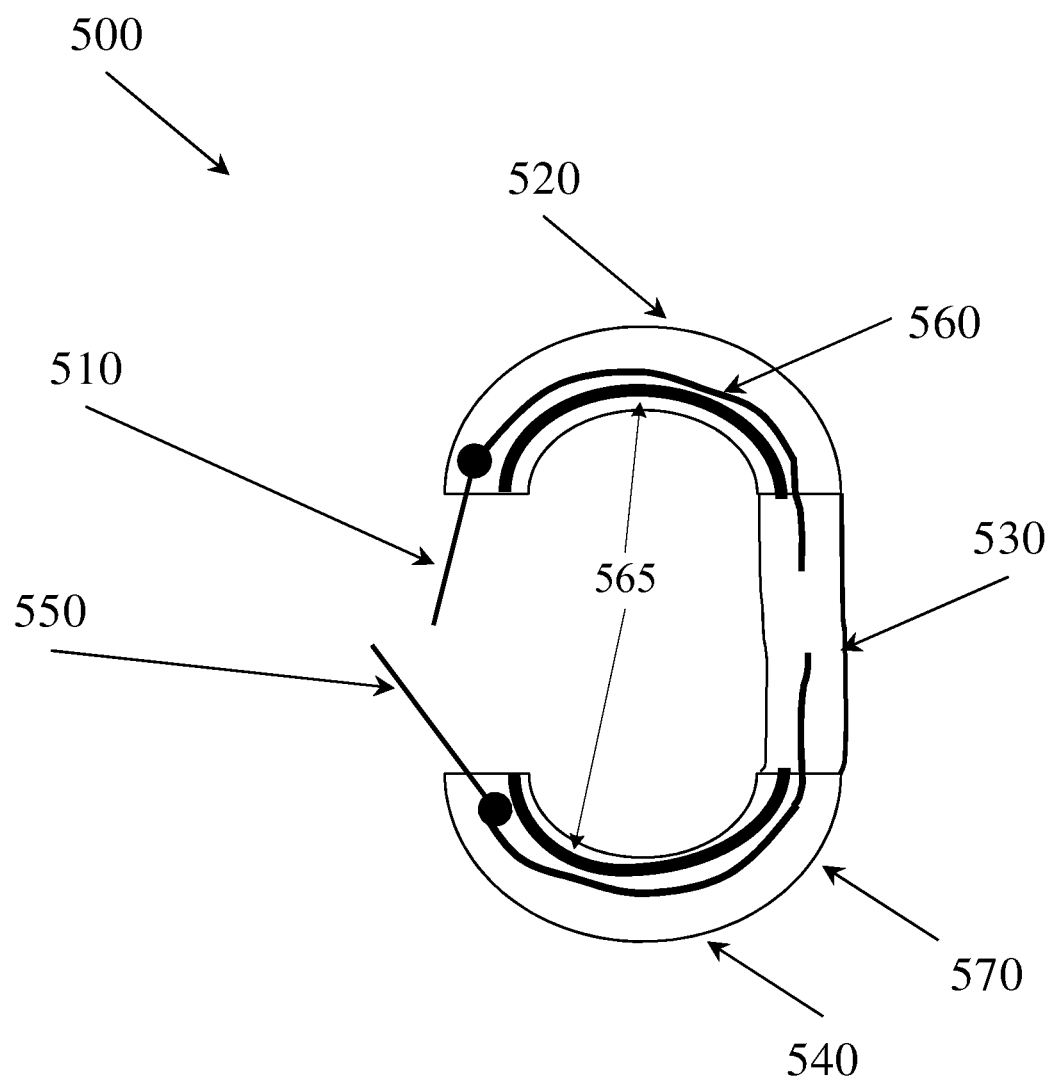
FIG. 5 illustrates an example coaxial cable MRI coil.

FIG. 5 illustrates an example coaxial cable MRI RF coil 500. Coil 500 has two terminals, a first terminal 510 and a second terminal 550. Terminal 510 and terminal 550 are connected by a coaxial cable at inner conductor 560. The coaxial cable is intact in region 520, is not intact in region 530, and is intact in region 540. The outer conductor 570 is continuous from terminal 510 to terminal 550. In region 530, the inner conductor 560 or a dielectric spacer 565 between inner conductor 560 and outer conductor 570 may have been cut. Varying the gap produced by cutting inner conductor 560 in region 530 may adjust the capacitance and thus the frequency of coil 500. Cutting the inner conductor 560 or dielectric spacer 565 will change the physical properties of the cable and thus the coil 500. The coil 500 includes an inductor formed from the outer conductor in regions 520 and 540, a capacitor between inner conductor 560 and outer conductor 570 in region 520, a capacitor between inner conductor 560 and outer conductor 570 in region 540, and an inductor from the outer conductor 570 in region 530. Cutting the inner conductor 560 or dielectric spacer 565 at longer or shorter lengths may increase or reduce the capacitance of the coil, may increase or reduce the inductance in region 530 and increase or decrease the inductance in region 520 and/or 540. Selectively cutting the inner conductor 560 or dielectric spacer 565 according to a pattern may produce a coil having a first frequency. The frequency may be a low frequency (e.g., 20-40 MHz at diameter 15 cm using standard 50 Ohm coax cable).

Figure 6:
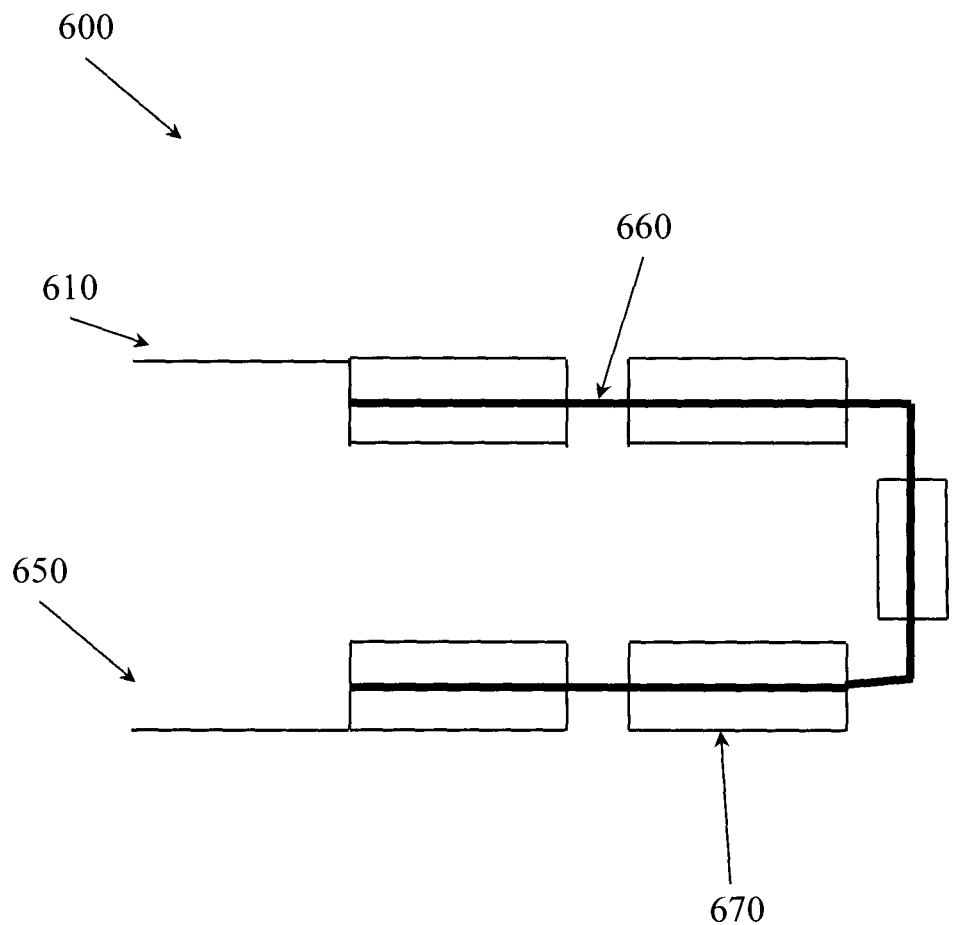
FIG. 6 illustrates an example coaxial cable MRI coil.

FIG. 6 illustrates an example coax MRI RF coil 600. Coil 600 has two terminals, a first terminal 610 and a second terminal 650. Terminal 610 and terminal 650 are connected by a coaxial cable. The inner conductor 660 is continuous from terminal 610 to terminal 650. The outer conductor 670 has been cut four times, which may reduce the capacitance of the coil 600 as compared to coil 500 (FIG. 5). Changing the capacitance of coil 600 also changes the frequency of coil 600. For example, coil 600 may have a higher frequency (e.g., 60->100 MHz with same dimension as FIG. 5). While FIG. 6 illustrates the outer conductor 670 being cut (e.g., stripped), recall that a capacitor requires two conductors separated by a dielectric. Thus, the capacitance for a coil fabricated from coax cable may be affected by cutting, stripping, or otherwise manipulating the outer conductor, the inner conductor, or the dielectric spacer.

Figure 7:
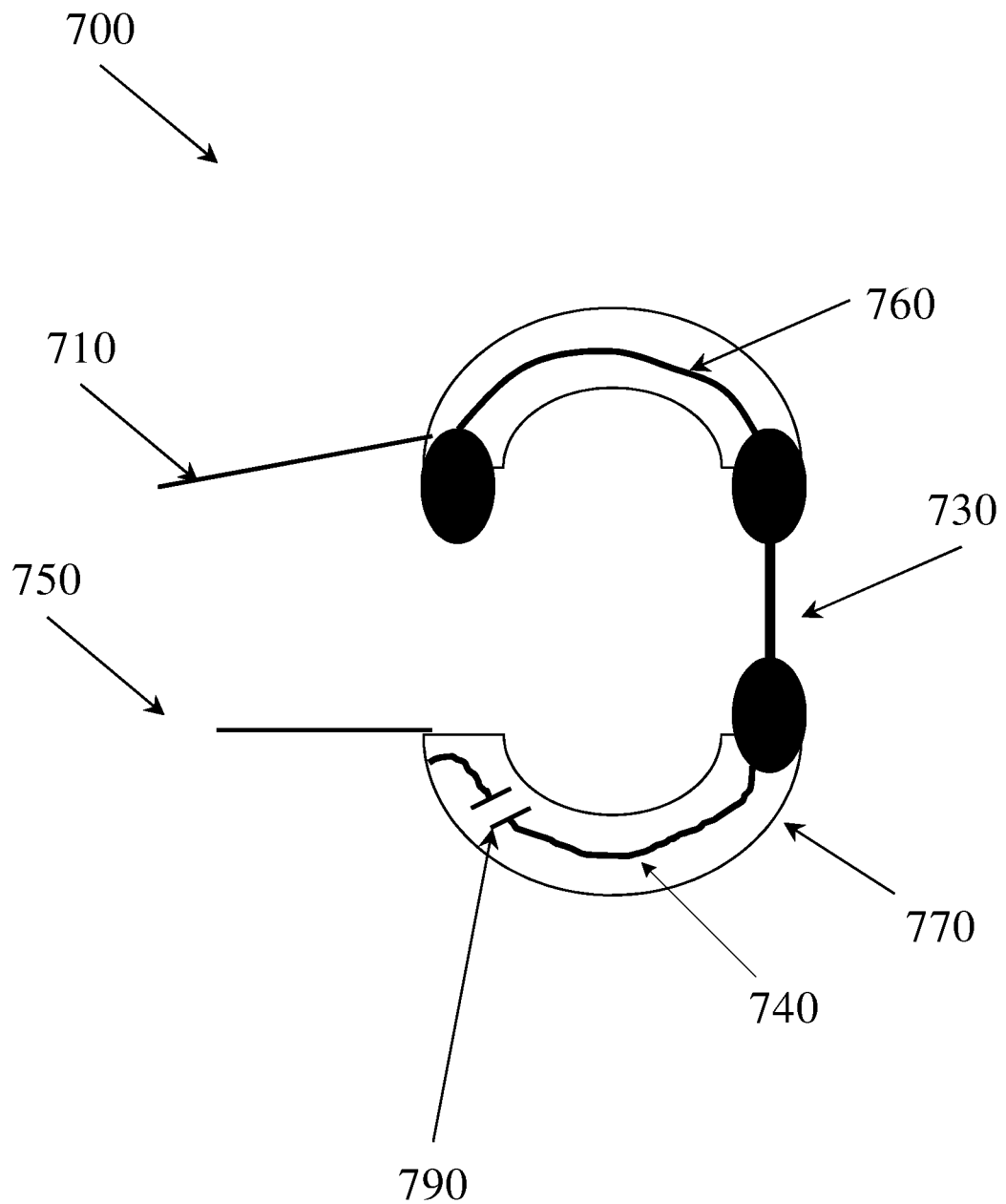
FIG. 7 illustrates an example coaxial cable MRI coil.

FIG. 7 illustrates an example coax MRI RF coil 700. Coil 700 has two terminals, a first terminal 710 and a second terminal 750. Terminal 710 and terminal 750 are connected by a coaxial cable. The inner conductor 760 is continuous from terminal 710 to terminal 750. A capacitor 790 has been placed near the terminal 750 and between the inner conductor 740 and outer conductor 770. Placing capacitor 790 near the terminal 750 makes the capacitance at cut 730 very high, which in turn makes the frequency for the entire coil 700 very low. Recall that the frequency for a coil may be described according to:

$$v = \frac{1}{2\Pi\sqrt{LC}}$$

The very low frequency may be, for example, 20-40 MHz.

Figure 8:
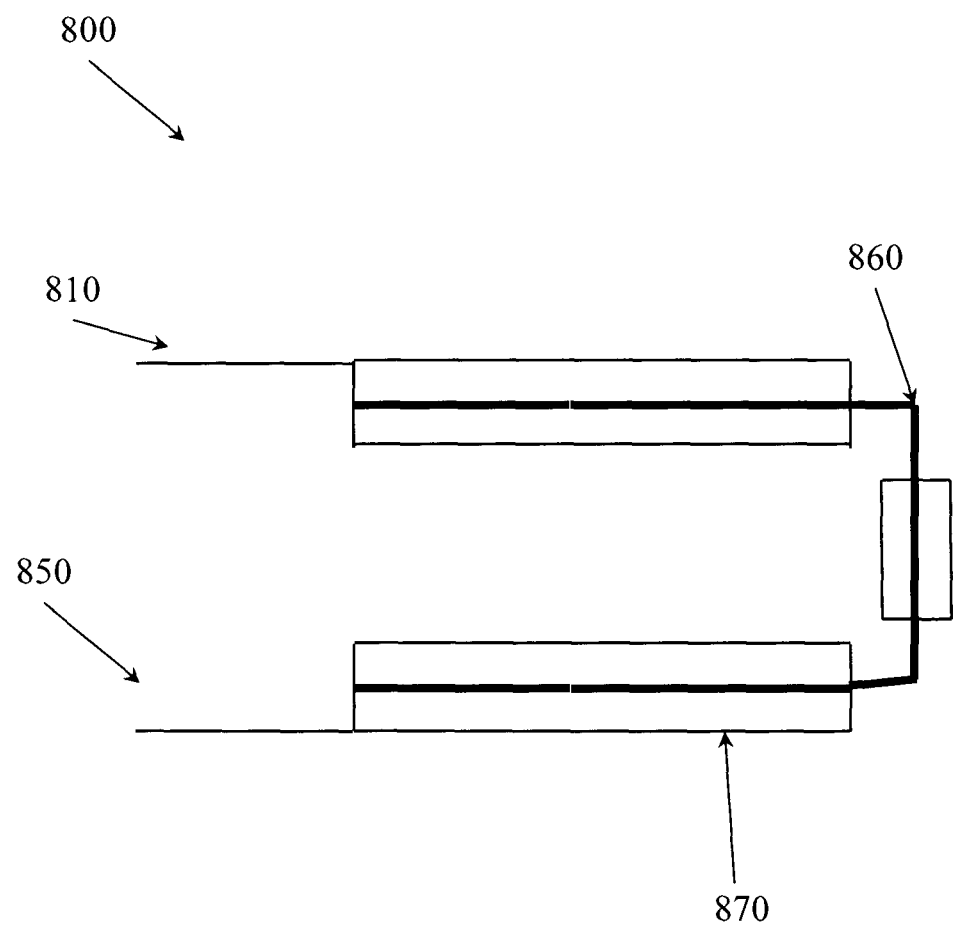
FIG. 8 illustrates an example coaxial cable MRI coil.

FIG. 8 illustrates an example coax MRI RF coil 800 with two cuts. Coil 800 has two terminals, a first terminal 810 and a second terminal 850. Terminal 810 and terminal 850 are connected by a coaxial cable. The inner conductor 860 is continuous from terminal 810 to terminal 850. The frequency of coil 800 is determined, at least in part, by the size, shape, number, or character of the cuts. For example, a first cut that strips the outer conductor 870 for a distance of 3 cm may produce a different result than a second cut that only strips the outer conductor 870 for 1 cm. Similarly, a complete stripping of the outer conductor 870 may produce a different result than a partial stripping of the outer conductor 870. Different results may be achieved by different manipulations of the inner conductor, the outer conductor, or the dielectric spacer between conductors of a capacitor.

Figure 9:
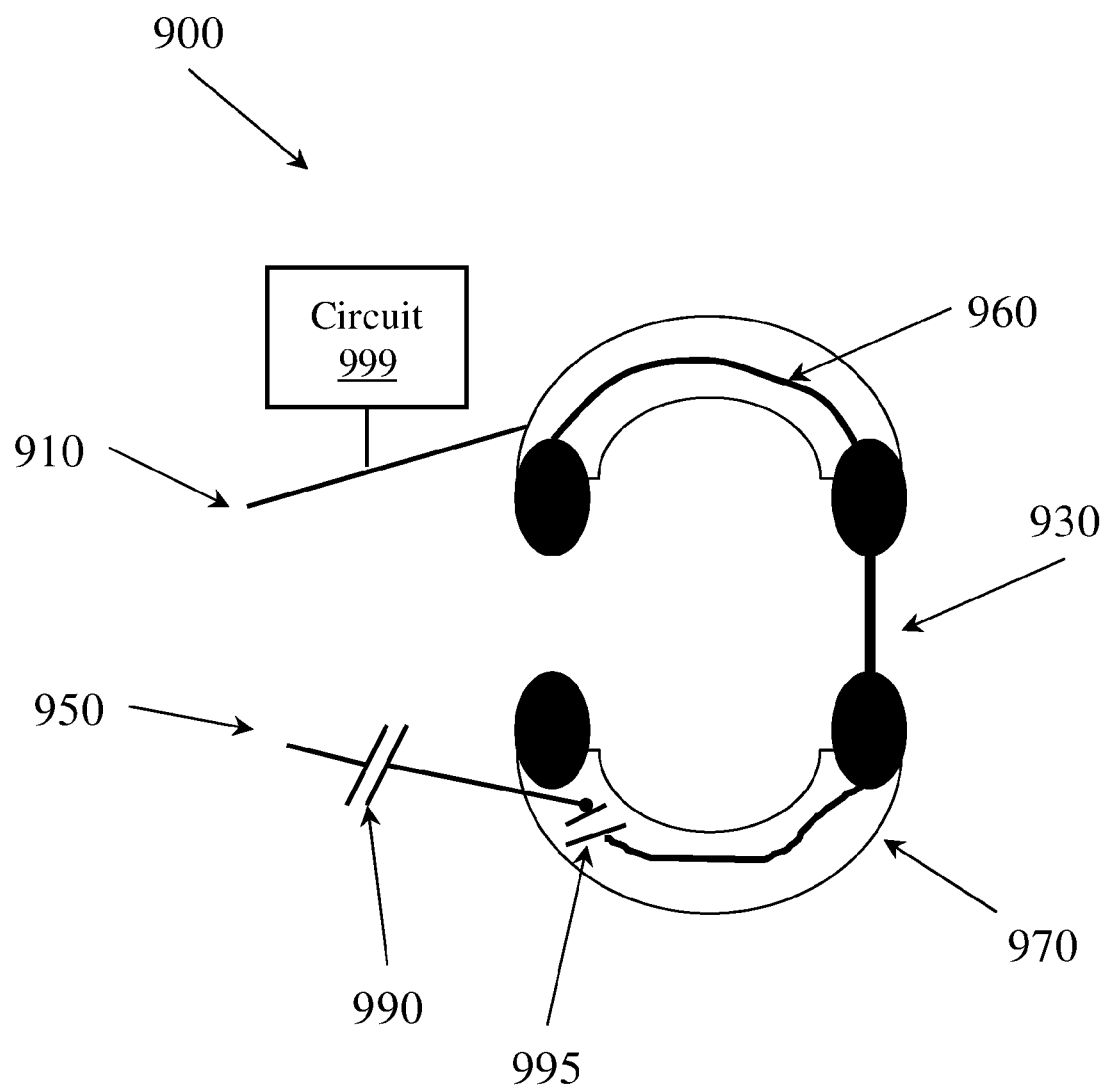
FIG. 9 illustrates an example coaxial cable MRI coil that includes an attached circuit.

FIG. 9 illustrates an example coax MRI RF coil 900 that includes a circuit 999. Coil 900 has two terminals, a first terminal 910 and a second terminal 950. Terminal 910 and terminal 950 are connected by a coaxial cable. The inner conductor 960 is continuous from terminal 910 to terminal 950. The outer conductor 970 has been stripped from region 930. A capacitor 995 and a capacitor 990 are included in coil 900. Circuit 999 may provide, for example, a pre-amplifier, a digital control, an analog control, or other function associated with an RF coil for MRI.

Figure 10:
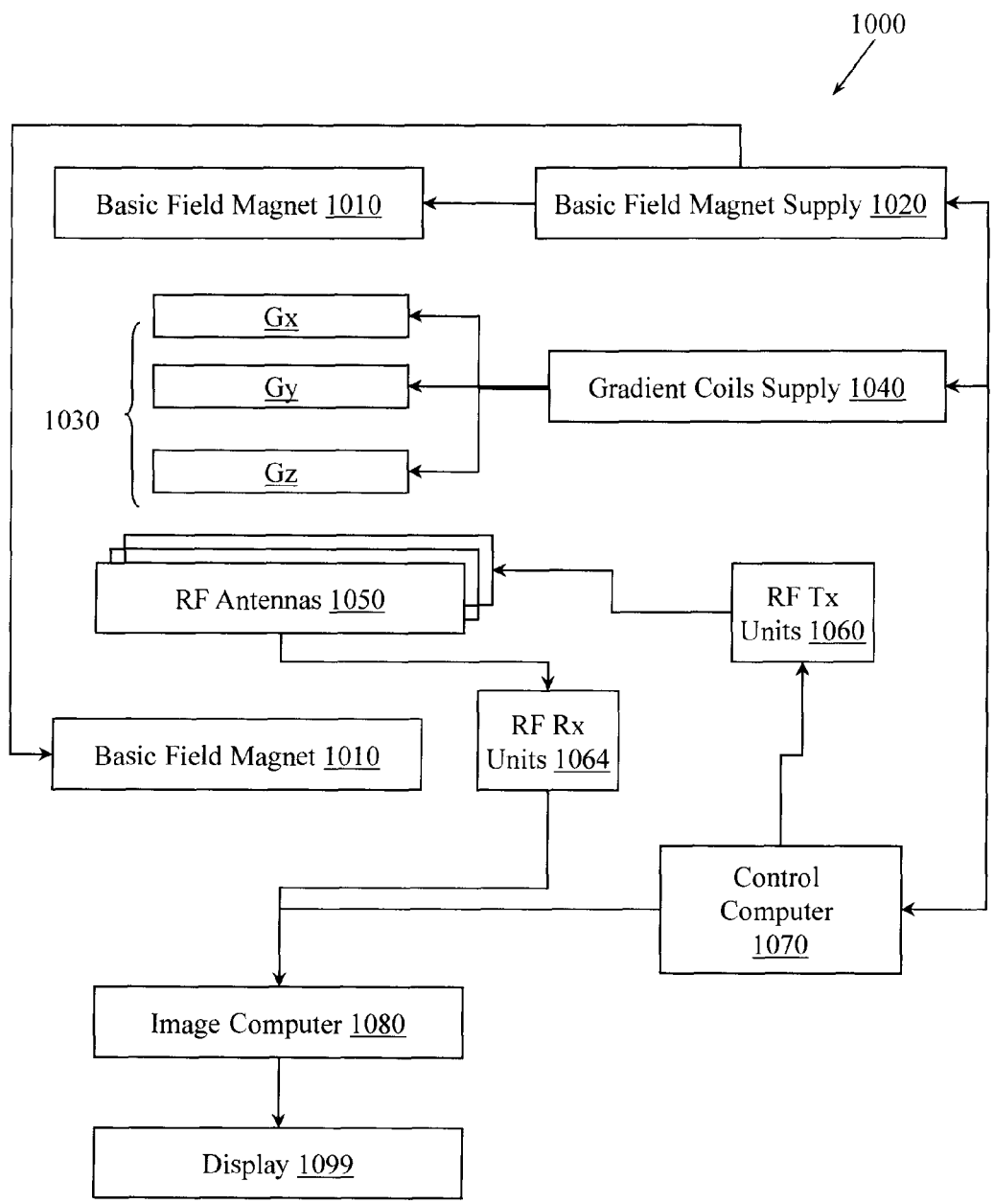
FIG. 10 illustrates an MRI apparatus configured with an example coaxial cable MRI RF coil.

FIG. 10 illustrates an example MRI apparatus 1000 configured with a set of example RF coils. The apparatus 1000 includes a basic field magnet(s) 1010 and a basic field magnet supply 1020. Ideally, the basic field magnets 1010 would produce a uniform B0 field. However, in practice, the B0 field may not be uniform, and may vary over an object being imaged by the MRI apparatus 1000. MRI apparatus 1000 may include gradient coils 1030 configured to emit gradient magnetic fields like $G_S$, $G_P$ and $G_R$. The gradient coils 1030 may be controlled, at least in part, by a gradient coils supply 1040. In some examples, the timing, strength, and orientation of the gradient magnetic fields may be controlled, and thus selectively adapted during an MRI procedure.

MRI apparatus 1000 may include a set of RF antennas 1050 that are configured to generate RF pulses and to receive resulting magnetic resonance signals from an object to which the RF pulses are directed. Separate RF transmission and reception coils can be employed. The RF antennas 1050 may be controlled, at least in part, by a set of RF transmission units 1060. An RF transmission unit 1060 may provide a signal to an RF antenna 1050. A set of RF reception units 1064 may receive a magnetic resonance signal from an RF antenna 1050. In one embodiment, the RF antenna 1050 may be fabricated from a coaxial cable. The capacitance in the coaxial cable and thus the frequency of the coil may be controlled, at least in part, by the size, shape, location, and number of cuts made in the coaxial cable.

The gradient coils supply 1040 and the RF transmission units 1060 may be controlled, at least in part, by a control computer 1070. The magnetic resonance signals received from the RF antennas 1050 can be employed to generate an image, and thus may be subject to a transformation process like a two dimensional FFT that generates pixilated image data. The transformation can be performed by an image computer 1080 or other similar processing device. The image data may then be shown on a display 1099. While FIG. 10 illustrates an example MRI apparatus 1000 that includes various components connected in various ways, it is to be appreciated that other MRI apparatus may include other components connected in other ways.

In one example, MRI apparatus 1000 may include control computer 1070. In one example, a member of the set of RF antennas 1050 may be individually controllable by the control computer 1070. Members of the set of RF antennas 1050 may be example coax cable MRI RF coils.

In one embodiment, an MRI RF coil may include a first terminal and a second terminal that are connected by a length of coaxial cable. In different embodiments, an inner conductor of the coaxial cable may be continuous or may be disrupted (e.g., cut, split, stripped) between the first terminal and the second terminal. In one embodiment, an outer conductor of the coaxial cable may be continuous or disrupted between the first terminal and the second terminal. In one embodiment, a dielectric spacer disposed between the inner conductor and the outer conductor may be continuous or may be disrupted between the first terminal and the second terminal. In different embodiments, the capacitance of the RF coil is controlled by the size, shape, number, or character of locations at which the inner conductor, the outer conductor, or the dielectric spacer are disrupted between the first terminal and the second terminal.

An example MRI RF coil may include a tuning capacitor, a matching capacitor, an inductor or other elements. An example MRI RF coil may include a control circuit that controls a current or voltage presented to the RF coil.

An MRI apparatus may include, among other components, a controller and an RF coil operably connected to the controller. The controller may provide the RF coil with a current, a voltage, or a control signal. The coil may be an example coax MRI RF coil as described herein.

The following includes definitions of selected terms employed herein. The definitions include various examples or forms of components that fall within the scope of a term and that may be used for implementation. The examples are not intended to be limiting. Both singular and plural forms of terms may be within the definitions.

References to "one embodiment", "an embodiment", "one example", and "an example" indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Logic", as used herein, includes but is not limited to hardware, firmware, software in execution on a machine, or combinations of each to perform a function(s) or an action(s), or to cause a function or action from another logic, method, or system. Logic may include a software controlled microprocessor, a discrete logic (e.g., ASIC), an analog circuit, a digital circuit, a programmed logic device, a memory device containing instructions, and other physical devices. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". The term "and/or" is used in the same manner, meaning "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

Although the subject matter has been described in language specific to structural features or methodological acts, it is to be understood that the subject matter defined in the appended claims is not necessarily limited to the specific features or acts described above. Rather, the specific features and acts described above are disclosed as example forms of implementing the claims.

What is claimed is:

1. A magnetic resonance imaging (MRI) radio frequency (RF) coil, where the MRI RF coil has a capacitance, the MRI RF coil comprising:
   a first terminal;
   a second terminal; and
   a coaxial cable that connects the first terminal and the second terminal,
   where an inner conductor of the coaxial cable is continuous between the first terminal and the second terminal, where an outer conductor of the coaxial cable is not continuous between the first terminal and the second terminal, and where a dielectric spacer disposed between the inner conductor and the outer conductor is continuous between the first terminal and the second terminal.

2. The MRI RF coil of claim 1, where the capacitance of the RF coil is controlled by the number of locations at which the outer conductor is disrupted between the first terminal and the second terminal.

3. The MRI RF coil of claim 1, where the capacitance of the RF coil is controlled by the size of a location at which the outer conductor is disrupted between the first terminal and the second terminal.

4. The MRI RF coil of claim 1, where the capacitance of the RF coil is controlled by the shape of a location at which the outer conductor is disrupted between the first terminal and the second terminal.

5. The MRI RF coil of claim 1, where the capacitance of the RF coil is controlled by the size of a location at which the dielectric spacer is disrupted between the first terminal and the second terminal.

6. The MRI RF coil of claim 1, where the capacitance of the RF coil is controlled by the shape of a location at which the dielectric spacer is disrupted between the first terminal and the second terminal.

7. The MRI RF coil of claim 1, comprising a tuning capacitor.

8. The MRI RF coil of claim 7, comprising a matching capacitor.

9. The MRI RF coil of claim 1, comprising an inductor.

10. The MRI RF coil of claim 1, comprising a control circuit that controls a current or voltage presented to the RF coil.

11. A magnetic resonance imaging (MRI) radio frequency (RF) coil, comprising:
a first terminal;
a second terminal; and
a coaxial cable that connects the first terminal and the second terminal,
where an inner conductor of the coaxial cable is not continuous between the first terminal and the second terminal,
where an outer conductor of the coaxial cable is continuous between the first terminal and the second terminal, and
where a dielectric spacer disposed between the inner conductor and the outer conductor is continuous between the first terminal and the second terminal.

12. A magnetic resonance imaging (MRI) radio frequency (RF) coil, comprising:
a first terminal;
a second terminal; and
a coaxial cable that connects the first terminal and the second terminal,
where an inner conductor of the coaxial cable is continuous between the first terminal and the second terminal,
where an outer conductor of the coaxial cable is continuous between the first terminal and the second terminal, and
where a dielectric spacer disposed between the inner conductor and the outer conductor is not continuous between the first terminal and the second terminal.

13. An MRI apparatus, comprising:
a controller, and
an RF coil operably connected to the controller,
where the controller provides the RF coil with a current, a voltage, or a control signal, and
where the coil comprises:
a first terminal;
a second terminal; and
a coaxial cable that connects the first terminal and the second terminal,
where an inner conductor of the coaxial cable is not continuous between the first terminal and the second terminal.

14. The MRI apparatus of claim 13, where an outer conductor of the coaxial cable is not continuous between the first terminal and the second terminal.

15. The MRI apparatus of claim 13, where a dielectric spacer disposed between an inner conductor of the coaxial cable and an outer conductor of the coaxial cable is not continuous between the first terminal and the second terminal.

* * * * *